United States Patent

Starr

[19]

[11] Patent Number: 5,982,191
[45] Date of Patent: Nov. 9, 1999

[54] BROADLY DISTRIBUTED TERMINATION FOR BUSES USING SWITCHED TERMINATOR LOGIC

[75] Inventor: Jonathan E. Starr, Cupertino, Calif.

[73] Assignee: Sun Microsystems, Inc., Palo Alto, Calif.

[21] Appl. No.: 08/881,925

[22] Filed: Jun. 25, 1997

[51] Int. Cl.[6] .................................................. H03K 17/16
[52] U.S. Cl. .................................. 326/30; 326/83; 326/86
[58] Field of Search ............................ 326/30, 82, 83, 326/86, 87

[56] References Cited

U.S. PATENT DOCUMENTS

| | | | |
|---|---|---|---|
| 4,694,205 | 9/1987 | Shu et al. | 327/530 |
| 4,707,620 | 11/1987 | Sullivan et al. | 326/30 |
| 4,719,369 | 1/1988 | Asano et al. | 326/87 |
| 4,743,784 | 5/1988 | Obara et al. | 307/530 |
| 4,804,871 | 2/1989 | Walters, Jr. | 807/530 |
| 4,831,287 | 5/1989 | Golab | 307/530 |
| 4,845,675 | 7/1989 | Krenik et al. | 365/203 |
| 4,855,628 | 8/1989 | Jun . | |
| 4,859,877 | 8/1989 | Cooperman et al. . | |
| 4,931,675 | 6/1990 | Iwata | 327/550 |
| 4,937,479 | 6/1990 | Hoshi | 327/550 |
| 4,959,563 | 9/1990 | Schenck . | |
| 5,134,311 | 7/1992 | Biber et al. | 326/87 |
| 5,162,672 | 11/1992 | McMahan et al. | 326/86 |
| 5,194,765 | 3/1993 | Dunlop et al. . | |
| 5,371,420 | 12/1994 | Nakao | 326/27 |
| 5,457,407 | 10/1995 | Shu et al. | 326/87 |
| 5,602,494 | 2/1997 | Sundstrom | 326/30 |
| 5,615,161 | 3/1997 | Mu | 365/208 |
| 5,644,252 | 7/1997 | Watarai | 326/27 |
| 5,666,078 | 9/1997 | Lamphier et al. | 327/108 |
| 5,726,583 | 3/1998 | Kaplinsky | 326/30 |
| 5,852,579 | 12/1998 | Arcoleo et al. | 365/189.05 |

FOREIGN PATENT DOCUMENTS 4-178995   6/1992   Japan ...................................... 327/52

OTHER PUBLICATIONS

Kevin S. Donnelly et al.; "A 660 MB/s Interface Megacell Portable Circuit in 0.3 $\mu$m–0.7 $\mu$m CMOS ASIC", IEEE Journal of Solid–State Circuits, vol. 31, No. 12, Dec. 1996.
Toshiro Takahashi et al.; "A CMOS Gate Array with 600Mb/s Simultaneous Biderectional I/O Circuits", Article from IEEE International Solid–State Circuits Conference, pp. 40–41. 1995.

Primary Examiner—Jon Santamauro
Assistant Examiner—Don Phu Le
Attorney, Agent, or Firm—Skjerven, Morrill, MacPherson, Franklin & Friel LLP; Stephen A. Terrile

[57] ABSTRACT

A bus line is provided with broadly distributed signal termination by using switched termination logic where the pull up resistance of a driver corresponds to the characteristic impedance of the line and the pull down resistance of the driver corresponds to the number of drivers coupled to the line. Accordingly, signals being transmitted over the bus suffer relatively few reflections thus advantageously producing a shortened signal settling time, thereby increasing the attainable signaling frequency.

18 Claims, 3 Drawing Sheets

BROADLY DISTRIBUTED TERMINATION FOR BUSES USING SWITCHED TERMINATOR LOGIC

BACKGROUND OF THE INVENTION

Cross-Reference to Related Applications

This application relates to co-pending U.S. patent application Ser. No. 08/883,187, attorney docket number SP-2128 US, filed on even date herewith, entitled Differential Receiver and naming Michael A. Ang, Alexander D. Taylor, and Jonathan E. Starr as inventors, the application being incorporated herein by reference in its entirety.

This application relates to co-pending U.S. patent application Ser. No. 08/881,926, attorney docket number SP-2489 US, filed on even date herewith, entitled Method for Resolving Differential Signals and naming Michael A. Ang, Alexander D. Taylor and Jonathan E. Starr as inventors, the application being incorporated herein by reference in its entirety.

This application relates to co-pending U.S. patent application Ser. No. 08/881,939 attorney docket number SP-2086 US, filed on even date herewith, entitled Impedance Control Circuit and naming Sai V. Vishwanthaiah, Alexander S. Taylor and Jonathan E. Starr as inventors, the application being incorporated herein by reference in its entirety.

This application relates to co-pending U.S. patent application Ser. No. 08/881,940, attorney docket number SP-2486 US, filed on even date herewith, entitled Method for Controlling the Impedance of a Driver Circuit and naming Sai V. Vishwanthaiah, Alexander S. Taylor and Jonathan E. Starr as inventors, the application being incorporated herein by reference in its entirety.

This application relates to co-pending U.S. patent application Ser. No. 08/881,938, attorney docket number SP-2547 US, filed on even date herewith, entitled Method for Determining Bit Element Values for Driver Impedance Control and naming Sai V. Vishwanthaiah, Alexander S. Taylor and Jonathan E. Starr as inventors, the application being incorporated herein by reference in its entirety.

This application relates to co-pending U.S. patent application Ser. No. 08/881,927, attorney docket number SP-2485 US, filed on even date herewith, entitled Method of Broadly Distributing Termination for Buses Using Switched Terminators and naming Jonathan E. Starr as inventor, the application being incorporated herein by reference in its entirety.

1. Field of the Invention

The present invention relates to buses and more particularly to termination of buses for use in information processing systems.

2. Description of the Related Art

In computer and information processing systems, various integrated circuit chips communicate digitally with each other over a common bus. The signal frequency at which this communication occurs can limit the performance of the overall system. Thus, the higher the communication frequency, the better. The maximum frequency at which a system communicates is a function not only of the time that it takes for the electromagnetic wavefronts to propagate on the bus from one chip to another, but also of the time required for the signals to settle to levels than can be recognized reliably at the receiving bus nodes as being high or low, referred to as the settling time.

The length of the settling time is a function of the amount of reflection and ringing that occurs on the signal bus. The more effective the termination of a bus system, the smaller the effects of reflection and ringing in the system and the shorter the overall settling time of the signal.

SUMMARY OF THE INVENTION

It has been discovered that a bus may be provided with broadly distributed signal termination by using switched termination logic where the pull up resistance of the driver corresponds to the characteristic impedance of the line and the pull down resistance of the driver corresponds to the number of drivers coupled to the line. Accordingly, signals being transmitted over the bus suffer relatively few reflections thus advantageously producing a shortened signal settling time, thereby increasing the attainable signaling frequency.

In a preferred embodiment, the invention relates to a driver apparatus for driving a signal onto a line having a characteristic impedance, the line having a number of drivers coupled thereto. The driver apparatus includes a pull up circuit and a pull down circuit. The pull up circuit pulls up a signal on the line and has a pull up resistance corresponding to the impedance of the line. The pull down circuit pulls down a signal on the line and has a pull down resistance corresponding to the number of drivers coupled to the line. Additionally, in preferred embodiments, the pull down resistance is substantially equal to the characteristic impedance of the line divided by the difference of the number of drivers coupled to the line minus one.

Additionally, in a preferred embodiment, the invention relates to a driver system which includes a line for transmitting a signal and a plurality of drivers. The line has a plurality of ends and the plurality of drivers are coupled to the plurality of ends. Each driver includes a pull up circuit and a pull down circuit. The pull up circuit pulls up a signal on the line and has a pull up resistance corresponding to the impedance of the line. The pull down circuit pulls down a signal on the line and has a pull down resistance corresponding to the number of drivers coupled to the line. Additionally, in preferred embodiments, the pull down resistance is substantially equal to the characteristic impedance of the line divided by the difference of the number of drivers coupled to the line minus one.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
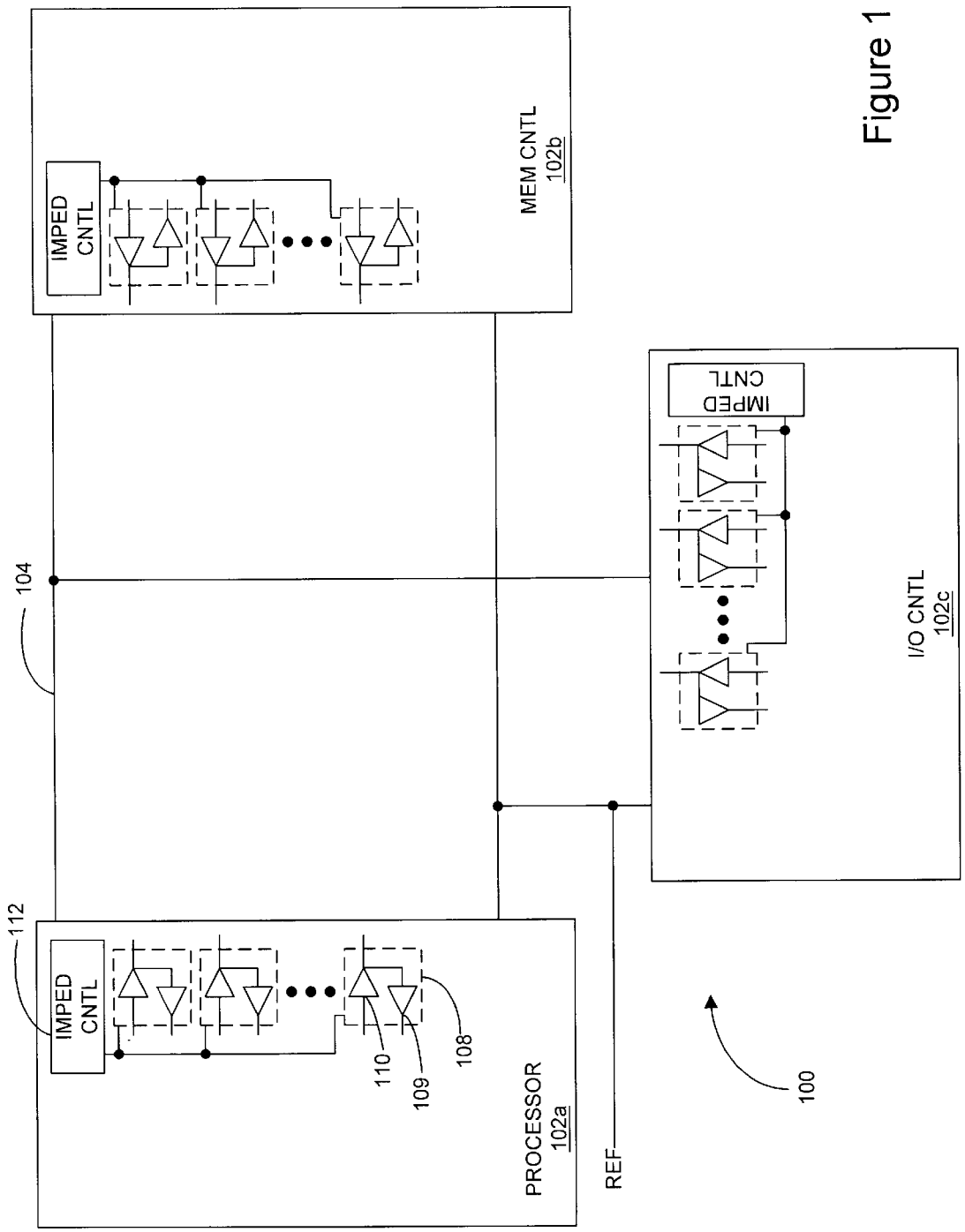
FIG. 1 shows a block diagram of an information handling system having a bus as well as driver circuits in accordance with the present invention.

Referring to FIG. 1, information handling system 100 includes a plurality of components 102 such as processor 102a, memory controller 102b, and I/O controller 102c. It will be appreciated that these components 102 may be any type of component commonly found in an information handling system. Each of these components 102 is generally configured as an individual integrated circuit chip. However, it is known to combine various components into a single integrated circuit chip. Components 102 are coupled via bus 104. Bus 104 includes a plurality of parallel lines which are coupled to individual signal outputs of each of the components 102. Components 102 are also coupled to a common reference voltage (REF)

Each component 102 includes a plurality of input/output circuits 108 which are coupled to individual signal paths of bus 104. Each input/output circuit 108 includes a receiver circuit 109 and a driver circuit 110. Each receiver circuit 109 is also coupled to the common reference voltage. Component 102 also includes impedance control circuit 112 which is coupled to each driver circuit 110. Impedance control circuit 112 controls driver circuits 110 so that the impedance of each pull up driver circuit is matched to that of the bus 104 and the impedance of each pull down driver circuit is equal to the impedance of the bus 104 divided by the difference of the number of drivers coupled to the bus minus one.

In operation, driver circuits 110 include switchable termination logic for controlling whether each driver circuit 110 is driving or terminating and thus each driver circuit includes circuitry which controls the pull up and pull down termination resistance of the driver circuit.

Figure 2:
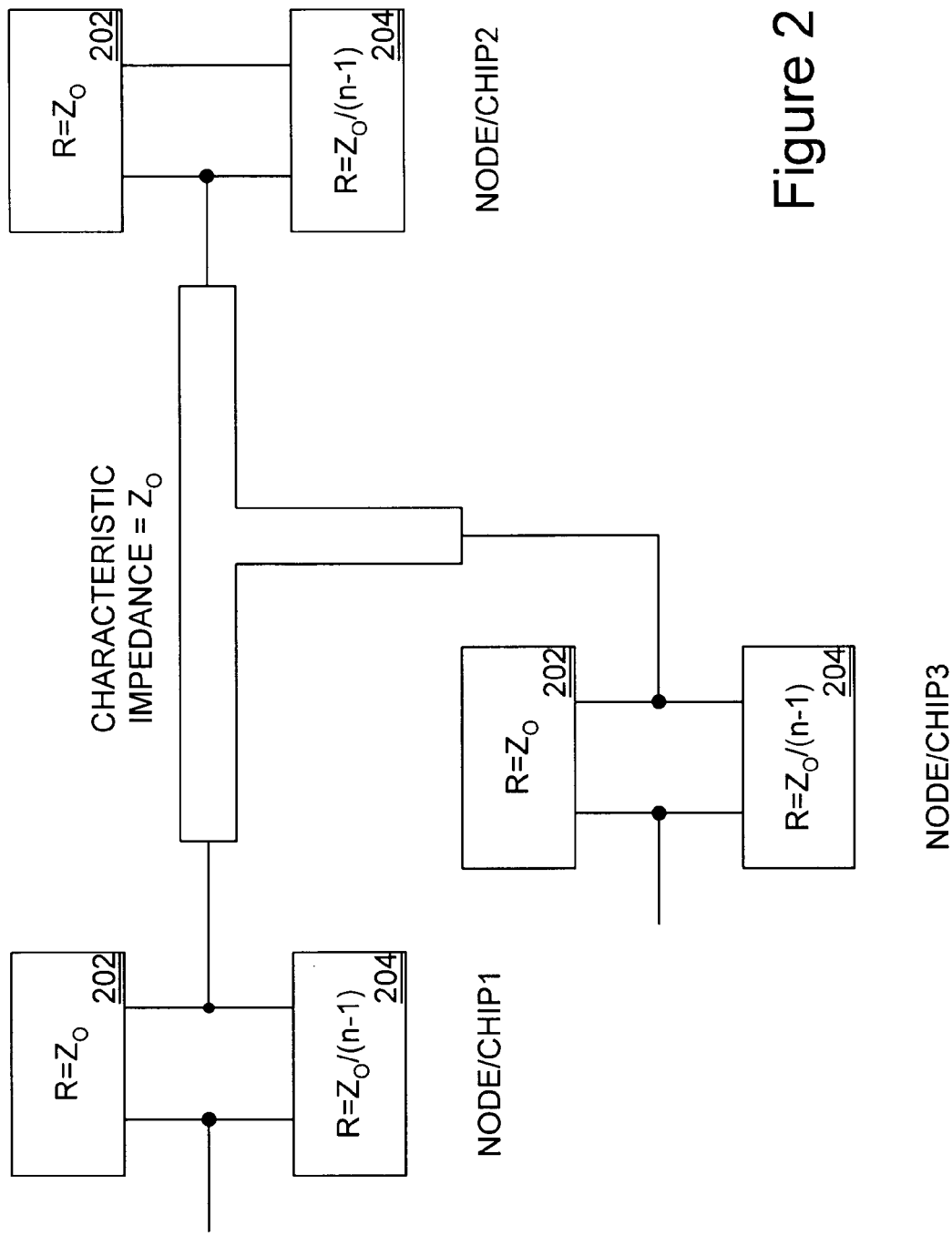
FIG. 2 shows a block diagram of broadly distributed termination using switched termination logic of the information handling system of FIG. 1.

Referring to FIG. 2, each driver circuit 110 of information handling system 100 includes a plurality of signal nodes coupled to bus 104 having a characteristic impedance of $Z_0$. Attached to each signal node at the end of a transmission line trace or stub is a the push-pull driver 110. Driver 110 includes a pull up driver circuit 202 and a pull down driver circuit 204. Pull up driver circuit 202 includes a pull up resistance that is substantially equal to (i.e., within 5% of) the characteristic impedance $Z_o$ of the transmission line. Pull down driver circuit 204 includes a pull down resistance that is substantially equal to (i.e., within 5% of)

$$\frac{Z_o}{n-1}$$

where n is the number of nodes in the information handling system 100. The receiver, if any, functions as a small capacitive load; however, no DC current flows between the receiver and the transmission line. Accordingly, the receiver does not contribute to the output impedance of the driver.

When a node is driving signals onto line 104, the driver 110 of the node either pulls the signal up or pulls the signal down, as appropriate to send the desired digital signal. When a node is receiving, the pull up portion of the driver remains active continuously, thereby functioning as a terminating resistance which is matched to the impedance of the transmission line.

However, because the pull down resistance at the driving node is equal to the net resistance of the parallel combination of the pull up portions of all of the receiving nodes, the signal swing on the bus 104 is from VDD to VDD/2. Accordingly, the receivers are capable of resolving a swing of VDD/2.

Because the impedance at each receiving node is matched to the impedance of the transmission line, signals arriving at the receiving node terminate without reflection. The impedance at the driving node is also matched to the line when driving high. However, the impedance at the driving node is mismatched when driving the signal low because the impedance is equal to $Z_o/(n-1)$ instead of $Z_o$. Accordingly, the only stub on which reflections are created is the stub with the driver when the driver pulls the signal low. Because there is an impedance mismatch at the intersection of this stub with the rest of the bus, only a fraction of these reflections, which fraction is already a fraction of the initial signal, are transmitted to the receiving nodes. This condition is preferable because the settling time of the receiving node is the crucial parameter to bus performance. The net effect of the absence of reflections from the stub ends can be a reduced overall settling time when compared to systems without termination at each receiving node.

In this configuration, the pull down resistance is $Z_o/(n-1)$ because, by having the pull up resistors on chip, the pull up resistance at the driving node is switched off when the driver is pulling low. Accordingly, this system advantageously consumes less overall current and power than a system that has an off chip pull up resistor that is always drawing current.

Additionally, providing the termination within each component 102 improves signal integrity when compared to having a termination resistor that is not within component 102. When the termination resistor is not within component 102, the terminator is actually separated from the receiving node by some distance along a transmission line and thus parasitics are introduced in the connection to the termination resistor. Also, because of the separation such a system can have reflections from the intersection of the stubs of the transmission line. However, when the termination is within each component, the termination resistance is placed right at the receiver, thereby reducing reflections and ringing.

Figure 3D:
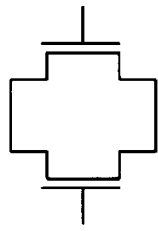
FIGS. 3A, 3B, 3C and 3D show schematic block diagrams of a variety of bit elements of the driver circuits having switched termination logic in accordance with the present invention.
Figure 3C:
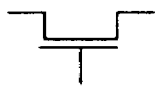
Figure 3B:
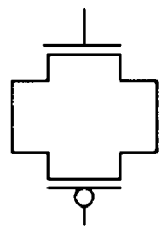
Figure 3A:

Referring to FIGS. 3A, 3B, 3C and 3D, the pull up and pull down elements of driver circuit 110 may be of a variety of configurations. For example, as shown in FIG. 3A, the driver element may be a PMOS transistor. Also for example, as shown in FIG. 3B, the driver element may be the parallel combination of a PMOS transistor and an NMOS transistor. With this parallel combination, it is the resistance of the parallel combination that would be equal to the desired bit element resistance. Also for example, as shown in FIG. 3C, the driver element may be an NMOS transistor. Also for example, as shown in FIG. 3D, the driver element may be the parallel combination of two NMOS transistors. In a preferred embodiment, the pull up driver element includes the parallel combination of the PMOS transistor and the NMOS transistor and the pull down element includes the parallel combination of two NMOS transistors. It will be appreciated that a driver circuit may have other circuitry that contributes to the overall pull up and pull down resistance of the driver.

Other Embodiments

Other embodiments are within the following claims.

For example, while a variety of configurations are disclosed for the pull up and pull down driver elements, it will be appreciated that other driver configurations may be used so long as the appropriate driver and termination resistances are maintained.

Also, in the present invention, a MOS transistor may be conceptualized as having a control terminal which controls the flow of current between a first current handling terminal and a second current handling terminal. Although MOS transistors are frequently discussed as having a drain, a gate, and a source, in most such devices the drain is interchangeable with the source. This is because the layout and semiconductor processing of the transistor is symmetrical (which is typically not the case for bipolar transistors). For an N-channel MOS transistor, the current handling terminal normally residing at the higher voltage is customarily called the drain. The current handling terminal normally residing at the lower voltage is customarily called the source. A sufficient voltage on the gate causes a current to therefore flow from the drain to the source. The gate to source voltage referred to in an N-channel MOS device equations merely refers to whichever diffusion (drain or source) has the lower voltage at any given time. For example, the "source" of an N-channel device of a bi-directional CMOS transfer gate depends on which side of the transfer gate is at a lower voltage. To reflect the symmetry of most N channel MOS transistors, the control terminal is the gate, the first current handling terminal may be termed the "drain/source", and the second current handling terminal may be termed the "source/drain". Such a description is equally valid for a P channel MOS transistor, since the polarity between drain and source voltages, and the direction of current flow between drain and source, is not implied by such terminology. Alternatively, one current handling terminal may be arbitrarily deemed the "drain" and the other deemed the "source", with an implicit understanding that the two are not distinct, but interchangeable.

What is claimed is:

1. A driver apparatus for driving a signal onto a line having a characteristic impedance, the line having a number of drivers coupled thereto, the driver apparatus comprising:

a pull up circuit, the pull up circuit pulling up a signal on the line, the pull up circuit having a pull up resistance corresponding to the impedance of the line; and a pull down circuit, the pull down circuit pulling down a signal on the line, the pull down circuit having a pull down resistance corresponding to the number of drivers coupled to the line, the pull down resistance being substantially equal to the characteristic impedance of the line divided by the difference of the number of drivers coupled to the line minus one.

2. The driver apparatus of claim 1 wherein the pull down circuit includes a parallel combination of two NMOS transistors.

3. The driver apparatus of claim 1 wherein the pull up resistance is substantially equal to the characteristic impedance of the line.

4. The driver apparatus of claim 1 wherein the pull up circuit includes a PMOS transistor.

5. The driver apparatus of claim 1 wherein the pull down circuit includes an NMOS transistor.

6. The driver apparatus of claim 1 wherein the pull up circuit includes a parallel combination of a PMOS transistor and an NMOS transistor.

7. A driver system comprising:

a line for transmitting a signal, the line having a plurality of ends; and a plurality of drivers coupled to the plurality of ends, each driver including a pull up circuit, the pull up circuit pulling up a signal on the line, the pull up circuit having a pull up resistance being substantially equal to the characteristic impedance of the line; and a pull down circuit, the pull down circuit pulling down a signal on the line, the pull down circuit having a pull down resistance being substantially equal to the characteristic impedance of the line divided by the difference of the number of drivers coupled to the line minus one.

8. A driver system comprising:

a line for transmitting a signal, the line having a plurality of ends; and a plurality of drivers coupled to the plurality of ends, each driver including a pull up circuit, the pull up circuit pulling up a signal on the line, the pull up circuit having a pull up resistance corresponding to the impedance of the line; and a pull down circuit, the pull down circuit pulling down a signal on the line, the pull down circuit having a pull down resistance corresponding to the number of drivers coupled to the line, the pull down resistance being substantially equal to the characteristic impedance of the line divided by the difference of the number of drivers coupled to the line minus one.

9. The driver system of claim 8 wherein the pull down circuit includes a parallel combination of two NMOS transistors.

10. The driver system of claim 8 wherein the pull up resistance is substantially equal to the characteristic impedance of the line.

11. The driver system of claim 8 wherein the pull up circuit includes a PMOS transistor.

12. The driver system of claim 8 wherein the pull down circuit includes an NMOS transistor.

13. The driver system of claim 8 wherein the pull up circuit includes a parallel combination of a PMOS transistor and an NMOS transistor.

14. A driver system comprising:

a line for transmitting a signal, the line having a plurality of ends; and a plurality of drivers coupled to the plurality of ends, each driver including a pull up circuit, the pull up circuit pulling up a signal on the line; and, a pull down circuit, the pull down circuit pulling down a signal on the line, wherein one of the pull up circuit and the pull down circuit has a resistance substantially equal to the characteristic impedance of the line and another of the pull up circuit and the pull down circuit has a resistance substantially equal to the characteristic impedance of the line divided by the difference of the number of drivers coupled to the line minus one.

15. The driver system of claim 14 wherein the pull up circuit includes a parallel combination of a PMOS transistor and an NMOS transistor.

16. The driver system of claim 14 wherein the pull down circuit includes a parallel combination of two NMOS transistors.

17. The driver system of claim 14 wherein the pull up circuit includes a PMOS transistor.

18. The driver system of claim 14 wherein the pull down circuit includes an NMOS transistor.

* * * * *